(12) United States Patent
Yang

(10) Patent No.: US 8,907,417 B2
(45) Date of Patent: Dec. 9, 2014

(54) SEMICONDUCTOR DEVICES INCLUDING VERTICAL TRANSISTORS, ELECTRONIC SYSTEMS INCLUDING THE SAME AND METHODS OF MANUFACTURING THE SAME

(71) Applicant: SK Hynix Inc., Icheon-si Gyeonggi-do (KR)

(72) Inventor: Ki Ho Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 10 days.

(21) Appl. No.: 13/718,787

(22) Filed: Dec. 18, 2012

(65) Prior Publication Data

US 2013/0334583 A1   Dec. 19, 2013

(30) Foreign Application Priority Data

Jun. 13, 2012 (KR) .................. 10-2012-0063201

(51) Int. Cl.
*H01L 29/66* (2006.01)
*H01L 27/108* (2006.01)
*H01L 29/78* (2006.01)

(52) U.S. Cl.
CPC ........ *H01L 27/108* (2013.01); *H01L 27/10844* (2013.01); *H01L 29/7827* (2013.01); *H01L 27/10823* (2013.01); *H01L 27/10876* (2013.01); *H01L 27/10885* (2013.01)
USPC ..... 257/332; 257/328; 257/618; 257/E29.118

(58) Field of Classification Search
CPC ............ H01L 29/7827; H01L 29/7813; H01L 29/66666; H01L 29/41766; H01L 29/7802; H01L 29/06; H01L 29/407; H01L 29/66712; H01L 27/1052; H01L 27/108; H01L 27/10823; H01L 27/10826; H01L 27/10879
USPC ......... 257/314, 324, 328, 329, 330, 331, 332, 257/353, 618, 623, E29.118, E29.131, 257/E29.183, E29.198, E29.257, E29.26, 257/E29.262
See application file for complete search history.

(56) References Cited

U.S. PATENT DOCUMENTS

| | | | |
|---|---|---|---|
| 2012/0243313 A1* | 9/2012 | Cai et al. .................. | 365/185.05 |
| 2013/0043525 A1* | 2/2013 | Yu et al. ......................... | 257/329 |
| 2013/0099305 A1* | 4/2013 | Kim et al. ..................... | 257/329 |
| 2014/0110781 A1* | 4/2014 | Hwang ......................... | 257/330 |

* cited by examiner

*Primary Examiner* — Eduardo A Rodela
(74) *Attorney, Agent, or Firm* — William Park & Associates Patent Ltd.

(57) ABSTRACT

Semiconductor devices are provided. The semiconductor device includes word lines on a semiconductor substrate, common gates connected to each of the word lines and vertically disposed in the semiconductor substrate, buried bit lines intersecting the word lines at a non-right angle in a plan view, and a pair of vertical transistors sharing each of the common gates. The pair of vertical transistors are disposed at both sides of one of the word lines, respectively. Further, the pair of vertical transistors are electrically connected to two adjacent ones of the buried bit lines, respectively. Electronic systems including the semiconductor device and related methods are also provided.

21 Claims, 31 Drawing Sheets

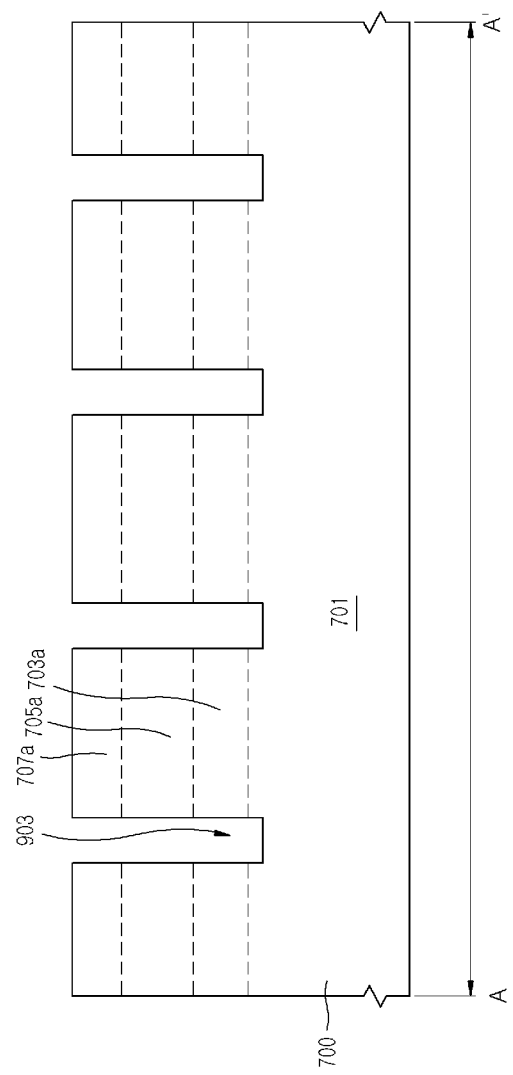

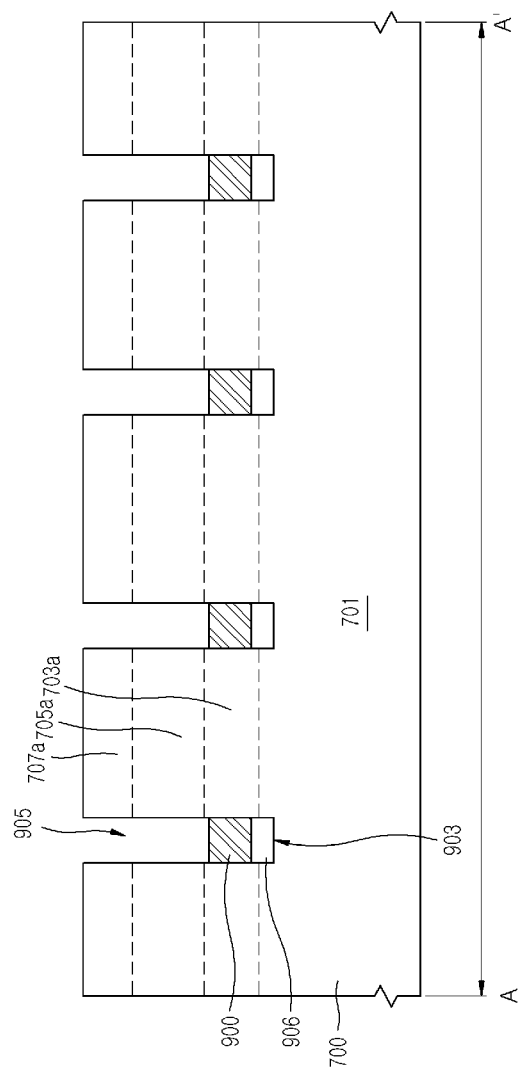

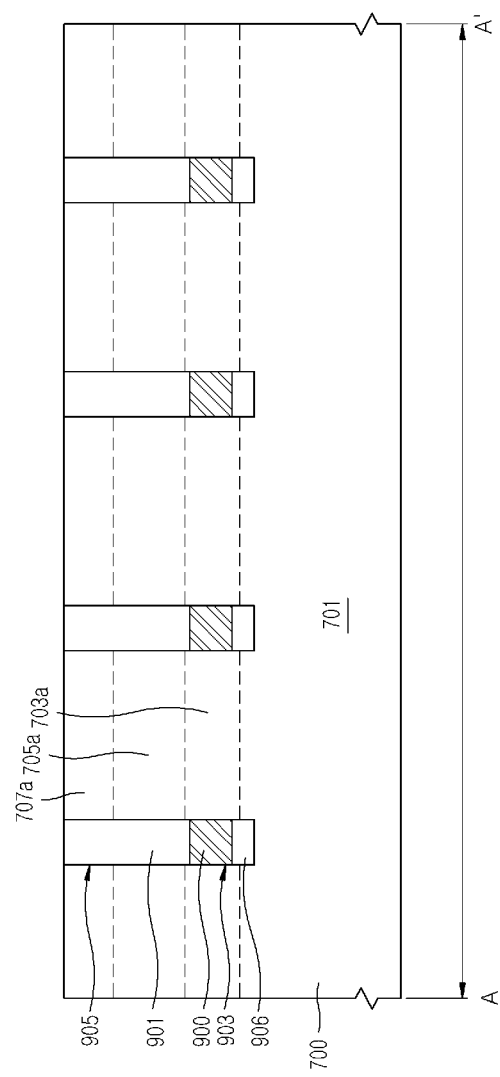

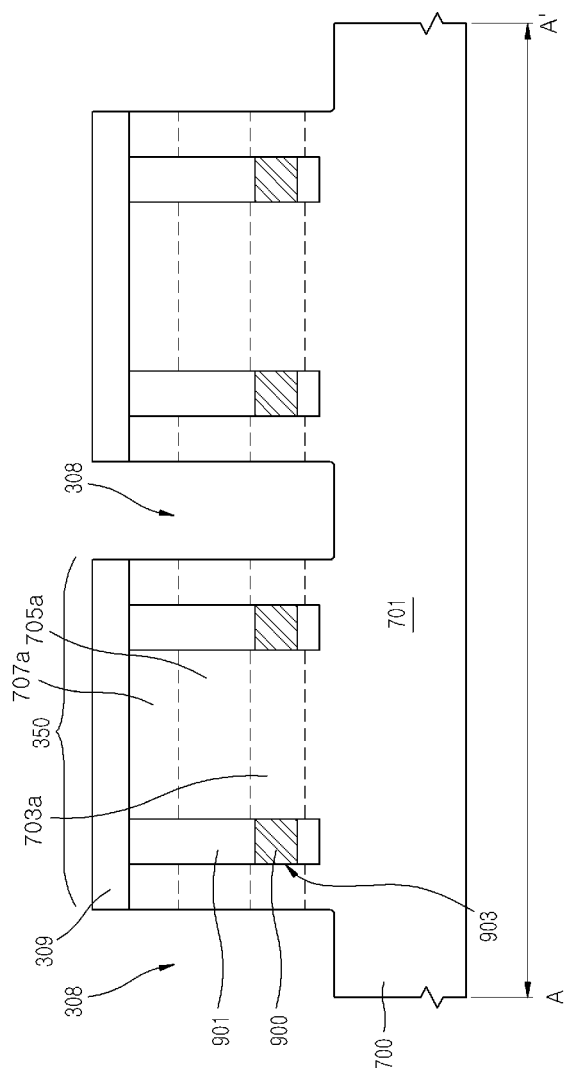

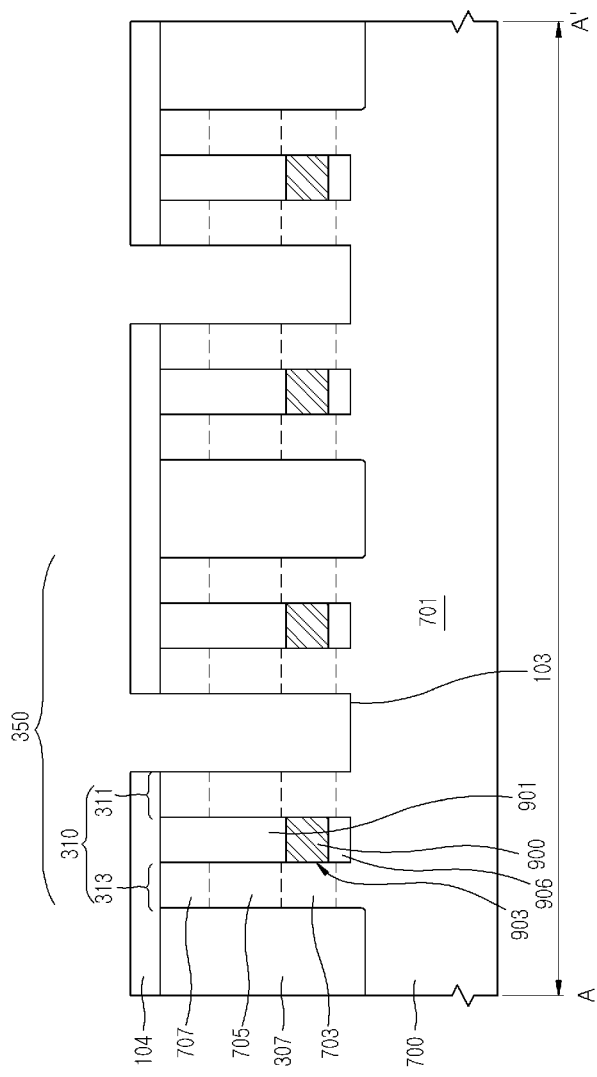

SEMICONDUCTOR DEVICES INCLUDING VERTICAL TRANSISTORS, ELECTRONIC SYSTEMS INCLUDING THE SAME AND METHODS OF MANUFACTURING THE SAME

CROSS-REFERENCE TO RELATED APPLICATION

The present application claims priority under 35 U.S.C 119(a) to Korean Application No. 10-2012-0063201, filed on Jun. 13, 2012, in the Korean intellectual property Office, which is incorporated herein by reference in its entirety as set forth in full.

BACKGROUND

Embodiments of the present disclosure relate to semiconductor devices and, more particularly, to semiconductor devices including vertical transistors, electronic systems including the same and methods of manufacturing the same.

In fabrication of semiconductor devices, various technologies for more integrating elements such as transistors in a limited area of a semiconductor substrate have been proposed to improve the throughput of the semiconductor devices. For example, dynamic random access memory (DRAM) technologies have been developed to realize a unit memory cell including a single cell transistor and a single cell capacitor in a unit area of about $4F^2$ ("F" denotes a minimum feature size). In response to the above requirements, planar transistors used as the cell transistors have been increasingly replaced with vertical transistors.

Each of the vertical transistors may be configured to include a drain region and a source region respectively disposed in an upper portion (or a lower portion) and a lower portion (or an upper portion) of an active pillar, and a gate electrode disposed on a sidewall of the active pillar between the drain region and the source region. When the vertical transistors are employed as the cell transistors of the DRAM devices, the drain regions in the active pillar may be electrically connected to bit lines and the source regions in the active pillars may be electrically connected to the cell capacitors acting as data storage elements. Thus, one of the cell capacitor and the bit line may be formed in a bulk region of semiconductor substrate. For example, when the drain regions of the vertical transistors are formed in the lower portions of the active pillars, the bit lines may be formed in the semiconductor substrate to have buried structures.

In the event that the bit lines of the DRAM devices are buried in the semiconductor substrate, it may be difficult to form the buried bit lines because the buried bit lines should be buried in the semiconductor substrate and should be electrically connected to the drain regions. That is, complicated processes may be required to electrically connect the buried bit lines to the drain regions of the active pillars.

SUMMARY

Example embodiments are directed to semiconductor devices including vertical transistors, electronic systems including the same and methods of manufacturing the same.

According to some embodiments, a semiconductor device includes word lines on a semiconductor substrate, common gates connected to each of the word lines and vertically disposed in the semiconductor substrate, buried bit lines interposed the word lines at a non-right angle in a plan view, and a pair of vertical transistors sharing each of the common gates. The pair of vertical transistors are disposed at both sides of one of the word lines, respectively. Further, the pair of vertical transistors are electrically connected to two adjacent ones of the buried bit lines, respectively.

According to further embodiments, a semiconductor device includes word lines on a semiconductor substrate, common gates connected to respective ones of cross points of the word lines and imaginary lines intersecting the word lines at a non-right angle in a plan view and vertically disposed in the semiconductor substrate, and transistor blocks including respective ones of the common gates. Each of the transistor blocks includes a pair of vertical transistors that are respectively disposed at both sides of one of the word lines to share one of the common gates. Buried bit lines intersect the word lines at a non-right in a plan view. The pair of vertical transistors in each of the transistor blocks are electrically connected to two adjacent ones of the buried bit lines, respectively.

According to further embodiments, a semiconductor device includes a pair of buried bit lines on a substrate body and a pair of vertical active pillars upwardly protruding from the substrate body. Lower portions of the pair of vertical active pillars are in contact with respective ones of the pair of buried bit lines. A common gate is disposed between the pair of vertical active pillars, and a word line is connected to the common gate. The word line intersects the pair of buried bit lines at a non-right angle in a plan view.

According to further embodiments, a semiconductor device includes a pair of buried bit lines on a substrate body, a pair of word lines intersecting the pair of buried bit lines at a non-right angle in a plan view, and a first transistor block and a second transistor block connected to respective ones of the pair of word lines. Each of the first and second transistor blocks includes a pair of vertical active pillars upwardly protruding from the substrate body and a common gate disposed between the pair of vertical active pillars to contact one of the pair of word lines. One of the pair of buried bit lines is electrically connected to a lower portion of one of the pair of active pillars in the first transistor block and a lower portion of one of the pair of active pillars in the second transistor block. The other of the pair of buried bit lines is electrically connected to a lower portion of the other of the pair of active pillars in the first transistor block and a lower portion of the other of the pair of active pillars in the second transistor block.

In some embodiments, four adjacent ones of the common gates may be located at respective ones of four vertices of a diamond shape in a plan view.

In some embodiments, four adjacent ones of the common gates may be located at respective ones of four vertices of a diamond shape in a plan view, and the transistor blocks may be arrayed on diagonal lines in an X-Y plane including an X-axis parallel with the word lines and a Y-axis perpendicular to the X-axis.

In some embodiments, the buried bit lines may be arrayed to be substantially parallel with the diagonal lines, and the pair of vertical transistors constituting each of the transistor blocks may correspond to a first vertical transistor and a second vertical transistor, respectively. Further, the first vertical transistors of the transistor blocks arrayed along one of the diagonal lines may be electrically connected to one of the buried bit lines.

In some embodiments, each of the pair of active pillars may include a drain region disposed on the substrate body and connected to one of the pair of buried bit lines, a channel region on the drain region opposite to the substrate body, and a source region on the channel region opposite to the drain region.

In some embodiments, the common gate may downwardly extend to cover sidewalls of the channel regions in the pair of active pillars.

In some embodiments, the common gate may downwardly extend to cover sidewalls of the channel regions and the drain regions in the pair of active pillars.

In some embodiments, the semiconductor device may further include a pair of data storage elements disposed on respective ones of upper portions of the pair of active pillars.

In some embodiments, each of the pair of data storage elements may include a capacitor.

In some embodiments, the pair of data storage elements may be disposed over respective ones of the pair of buried bit lines.

In some embodiments, each of the pair of active pillars may include a drain region disposed on the substrate body and electrically connected to one of the pair of buried bit lines, a channel region on the drain region opposite to the substrate body, and a source region on the channel region opposite to the drain region.

In some embodiments, the common gates may downwardly extend to cover sidewalls of the channel regions of the active pillars in the first and second transistor blocks.

In some embodiments, the common gates may downwardly extend to cover sidewalls of the channel regions and the drain regions of the active pillars in the first and second transistor blocks.

In some embodiments, the semiconductor device may further include capacitors disposed on respective ones of the source regions of the active pillars in the first and second transistor blocks.

In some embodiments, the common gates of the first and second transistor blocks may be disposed on a diagonal line which is substantially parallel with the buried bit lines in a plan view.

In some embodiments, the first and second transistor blocks may be disposed on a diagonal line which is substantially parallel with the buried bit lines in a plan view.

In some embodiments, the pair of active pillars in each of the first and second transistor blocks may be disposed at both sides of one of the pair of word lines, respectively. Further, the pair of active pillars in each of the first and second transistor blocks may be mirror symmetric with respect to the word line therebetween.

According to further embodiments, a method of manufacturing a semiconductor device includes forming a pair of buried bit lines in a semiconductor substrate and defining a portion of the semiconductor substrate as an island-shaped active block. The active block is defined to include the pair of buried bit lines. A common gate is formed in the active block to divide the active block into a pair of active pillars which are spaced apart from each other. The pair of buried bit lines are located in respective ones of the pair of active pillars. A word line is formed on the common gate. The word line is formed to intersect the pair of buried bit lines at a non-right angle in a plan view and is electrically connected to the common gate.

According to further embodiments, a method of manufacturing a semiconductor device includes forming a pair of buried bit lines in a semiconductor substrate and forming a pair of vertical transistors sharing a common gate vertically disposed between the pair of buried bit lines. The pair of vertical transistors are electrically connected to respective ones of the pair of buried bit lines. A word line electrically connected to the common gate is formed on the semiconductor substrate.

According to further embodiments, a method of manufacturing a semiconductor device includes forming a pair of buried bit lines in a semiconductor substrate and forming a pair of vertical active pillars. Lower portions of the pair of vertical active pillars are electrically connected to respective ones of the pair of buried bit lines. A common gate vertically disposed between the pair of vertical active pillars is formed. A word line electrically connected to the common gate is formed. The word line is formed to intersect the pair of buried bit lines at a non-right angle in a plan view.

In some embodiments, forming the pair of buried bit lines may include forming a pair of bit line trenches in the semiconductor substrate and forming a pair of conductive patterns in respective ones of lower portions of the pair of bit line trenches.

In some embodiments, the method may further include forming a pair of bottom insulation patterns on respective ones of bottom surfaces of the pair of bit line trenches prior to formation of the pair of buried bit lines.

In some embodiments, the method may further include forming a pair of buried insulation patterns in respective ones of the pair of trenches on the pair of buried bit lines after forming the pair of conductive patterns.

In some embodiments, the semiconductor substrate may be formed to include a substrate body, a drain region layer, a channel region layer and a source region layer which are sequentially stacked.

In some embodiments, forming the pair of buried bit lines may include etching the source region layer, the channel region layer and the drain region layer to form a pair of bit line trenches, and forming a pair of conductive patterns in respective ones of lower portions of the pair of bit line trenches. Bottom surfaces of the pair of bit line trenches may be located at a level between an upper surface and a lower surface of the drain region layer.

In some embodiments, forming the pair of buried bit lines may include etching the source region layer, the channel region layer and the drain region layer to form a pair of bit line trenches, and forming a pair of conductive patterns in respective ones of lower portions of the pair of bit line trenches. The pair of bit line trenches may be formed to expose the substrate body.

In some embodiments, the semiconductor substrate may be formed to include a substrate body, a drain region layer, a channel region layer and a source region layer which are sequentially stacked. The drain region layer, the channel region layer and the source region layer may be formed by injecting first impurities, second impurities and third impurities into the semiconductor substrate, respectively.

In some embodiments, the first impurities, the second impurities and the third impurities may be implanted into the semiconductor substrate with different energies from each other.

In some embodiments, defining a portion of the semiconductor substrate as the island-shaped active block may include etching a portion of the semiconductor substrate to form an isolation trench defining the active block and forming an isolation layer in the isolation trench.

In some embodiments, forming the common gate may include etching a portion of the active block to form a gate hole that divides the active block into the pair of active pillars and forming the common gate in the gate hole.

According to further embodiments, an electronic system includes a main board and a semiconductor device mounted on the main board. The semiconductor device includes word lines on a semiconductor substrate, common gates connected to each of the word lines and vertically disposed in the semiconductor substrate, buried bit lines intersecting the word lines at a non-right angle in a plan view, and a pair of vertical transistors sharing each of the common gates. The pair of vertical transistors are disposed at both sides of one of the word lines, respectively. Further, the pair of vertical transistors are electrically connected to two adjacent ones of the buried bit lines, respectively.

BRIEF DESCRIPTION OF THE DRAWINGS

The above and other aspects, features and other advantages will be more clearly understood from the following detailed description taken in conjunction with the accompanying drawings, in which:

FIGS. 6A to 15A are cross sectional views taken along a line A-A' of FIG. 4 to illustrate a method of manufacturing a semiconductor device according to some embodiments;

FIGS. 6B to 15B are cross sectional views taken along a line A'-A" of FIG. 4 to illustrate a method of manufacturing a semiconductor device according to some embodiments;

DETAILED DESCRIPTION OF THE EMBODIMENTS

Semiconductor devices according to embodiments may include vertical cell transistors and buried bit lines electrically connected to the vertical cell transistors, and two adjacent ones of the vertical transistors may share a vertical common gate. The buried bit lines may be disposed to cross the word lines at a non-right angle in a plan view.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Further, the term "and/or" used herein includes any and all combinations of one or more of the associated listed items.

It will be also understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the inventive concept.

It will be further understood that the term "substrate" used herein may correspond to a semiconductor substrate or a semiconductor wafer having a semiconductor chip in which an integrated circuit such as a DRAM circuit or a flash memory circuit is realized.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
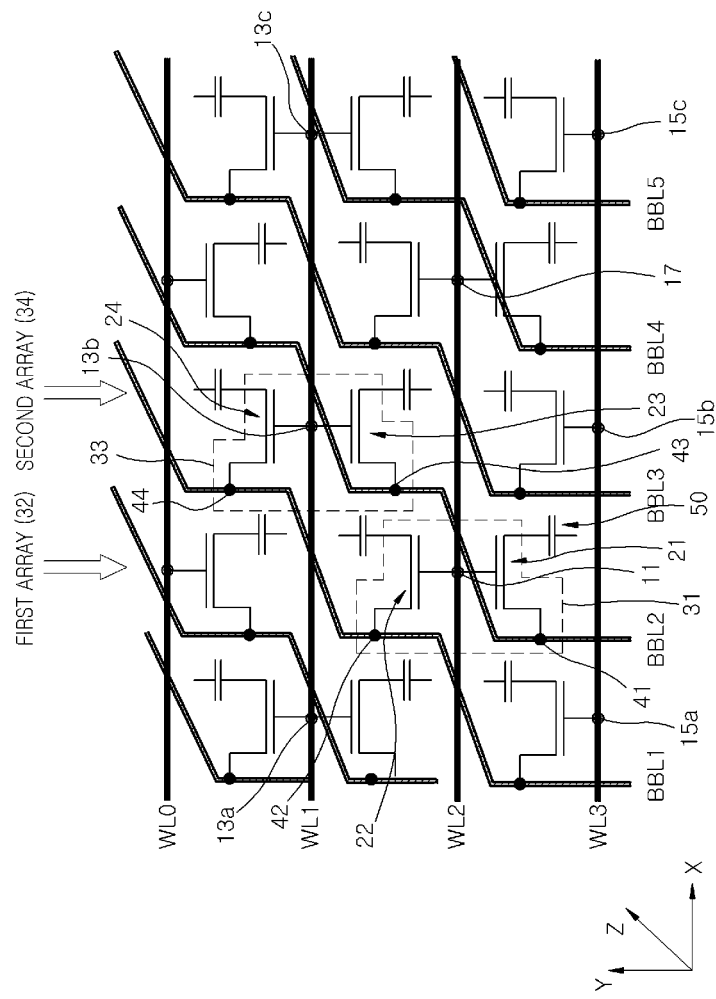
FIGS. 1, 2 and 3 are schematic diagrams illustrating a semiconductor device according to some embodiments.
Figure 2:
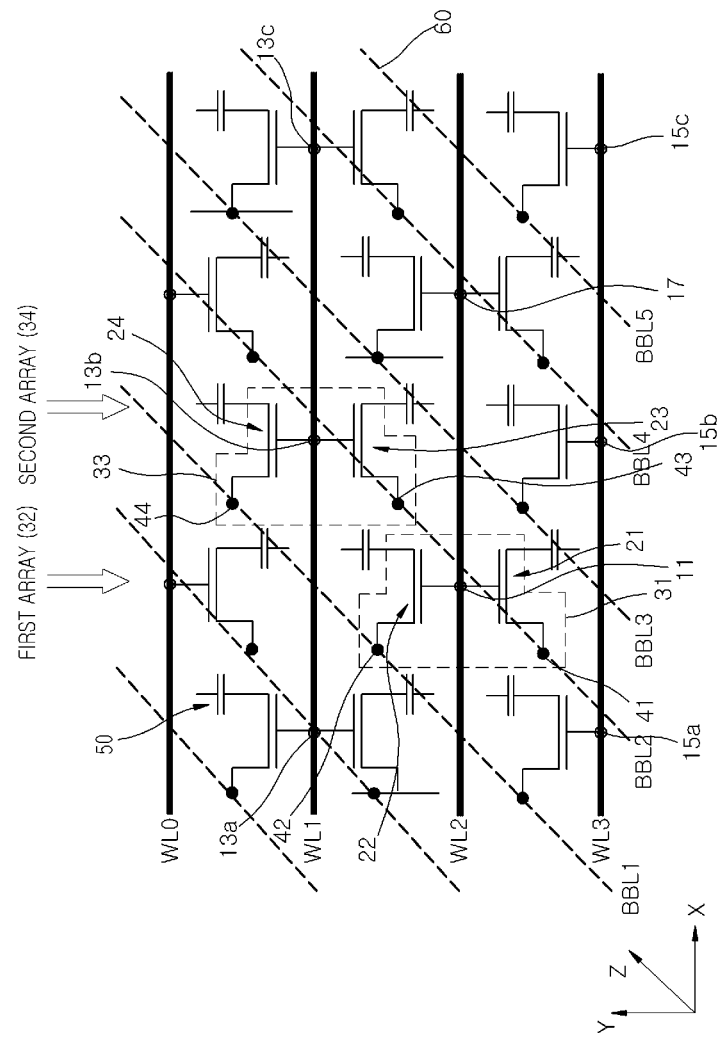
Figure 3:
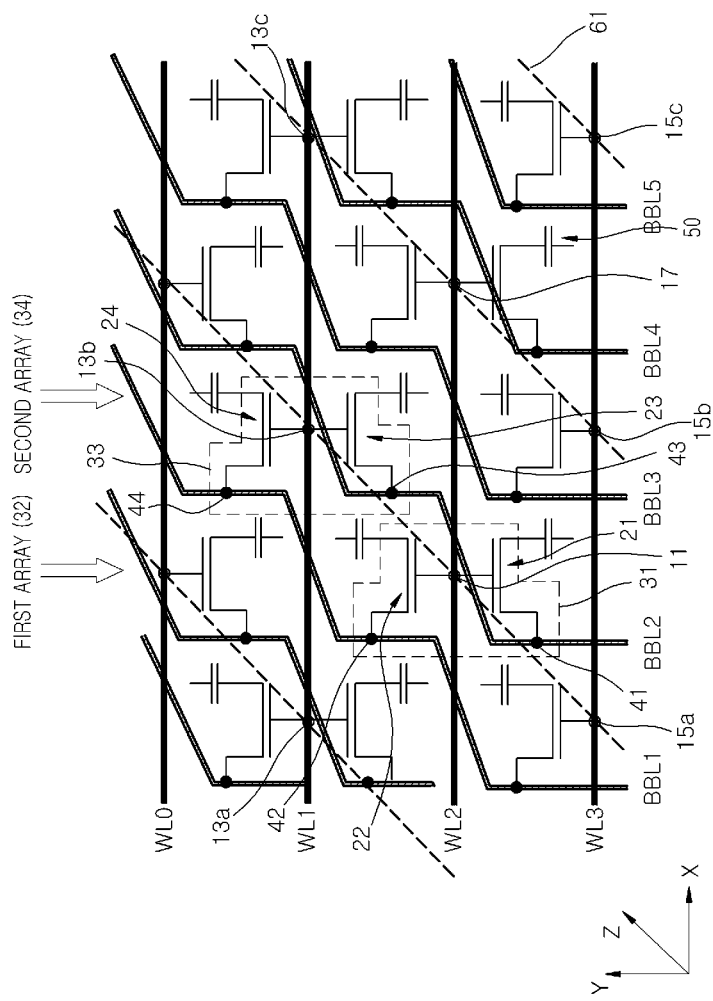

FIGS. 1, 2 and 3 are schematic diagrams illustrating a semiconductor device according to some embodiments.

Referring to FIG. 1, a semiconductor device according to some embodiments may be a DRAM device including a plurality of DRAM cells, and each of the DRAM cells may includes a vertical transistor acting as a switching element and a capacitor acting as a data storage element. A plurality of word lines WL0, WL1, WL2 and WL3 for controlling the input and output of data may be disposed to be parallel with an X-axis, and buried bit lines BBL1, BBL2, BBL3, BBL4 and BBL5 may be disposed to intersect the word lines WL0, WL1, WL2 and WL3. The semiconductor device may be formed to have a three dimensional structure on and/or in a semiconductor substrate. The word lines WL0, WL1, WL2 and WL3 may be disposed on the semiconductor substrate and the buried bit lines BBL1, BBL2, BBL3, BBL4 and BBL5 may be disposed in the semiconductor substrate.

The buried bit lines BBL1, BBL2, BBL3, BBL4 and BBL5 may be disposed not to be parallel with a Y-axis which is perpendicular to the word lines WL0, WL1, WL2 and WL3 in a plan view. That is, the buried bit lines BBL1, BBL2, BBL3, BBL4 and BBL5 may be arrayed to be parallel with a Z-axis corresponding to a diagonal line in an X-Y plane, as illustrated in FIG. 1. Accordingly, the buried bit lines BBL1, BBL2, BBL3, BBL4 and BBL5 may intersect the word lines WL0, WL1, WL2 and WL3 at a non-right angle in an X-Y plane. Although the buried bit lines BBL1, BBL2, BBL3, BBL4 and BBL5 in FIG. 1 are illustrated as being bent, the buried bit lines BBL1, BBL2, BBL3, BBL4 and BBL5 may be substantially straight lines 60 which are parallel with the Z-axis as illustrated in FIG. 2.

The word lines WL0, WL1, WL2 and WL3 may be electrically connected to gates of the vertical transistors, and the buried bit lines BBL1, BBL2, BBL3, BBL4 and BBL5 may be electrically connected to the drain regions of the vertical transistors. If a word line signal having a logic "high" level is applied to any one selected from the word lines WL0, WL1, WL2 and WL3 and a bit line signal is applied to any one selected from the buried bit lines BBL1, BBL2, BBL3, BBL4 and BBL5, a datum corresponding to the bit line signal may be stored in the capacitor of the DRAM cell located at a cross point of the selected word line and the selected buried bit line. Further, if a word line signal having a logic "high" level is applied to any one selected from the word lines WL0, WL1, WL2 and WL3 and any one selected from the buried bit lines BBL1, BBL2, BBL3, BBL4 and BBL5 is electrically connected to a sense amplifier, a datum stored in the capacitor of the DRAM cell located at a cross point of the selected word line and the selected buried bit line may be outputted through the selected buried bit line.

Each of the word lines WL0, WL1, WL2 and WL3 may be electrically connected to a plurality of vertical common gates (also, referred to as "common gates"). For example, the word line WL1 may be electrically connected to the common gates 13a, 13b and 13c, the word line WL2 may be electrically connected to the common gates 11 and 17, and WL3 may be electrically connected to the common gates 15a, 15b and 15c. Further, each of the common gates 13a, 13b, 13c, 11, 17, 15a, 15b and 15c may be electrically connected to gates of the pair of adjacent vertical transistors. That is, as illustrated in FIG. 1 or 2, the pair of adjacent vertical transistors 21 and 22 may share the first common gate 11. Thus, gates of the first and second vertical transistors 21 and 22 may be electrically connected to the word line WL2 through the first common gate 11. The pair of adjacent vertical transistors 21 and 22 may constitute a first transistor block 31, and the first common gate 11 may control the operation of the first transistor block 31 including the pair of adjacent vertical transistors 21 and 22.

The pair of adjacent vertical transistors 21 and 22 constituting the first transistor block 31 may be located at both sides of the first common gate 11, respectively. Accordingly, the pair of adjacent vertical transistors 21 and 22 may also be located at both sides of the word line WL2 connected to the first common gate 11, respectively. That is, the pair of adjacent vertical transistors 21 and 22 may be disposed to be symmetrical with respect to the word line WL2 which is perpendicular to the Y-axis, thereby constituting the first transistor block 31. The first transistor block 31 may be repeatedly arrayed along the Y-axis to constitute a first array 32.

The word line WL1 may be electrically connected to the second common gate 13b, and the second common gate 13b may be electrically connected to gates of the pair of adjacent vertical transistors 23 and 24. That is, the pair of adjacent vertical transistors 23 and 24 may share the second common gate 13b. The pair of adjacent vertical transistors 23 and 24 may constitute a second transistor block 33. The pair of adjacent vertical transistors 23 and 24 may be located at both sides of the word line WL1 connected to the second common gate 13b, respectively. That is, the pair of adjacent vertical transistors 23 and 24 may be disposed to be symmetrical with respect to the word line WL1 which is perpendicular to the Y-axis. The second transistor block 33 including the pair of adjacent vertical transistors 23 and 24 may be repeatedly arrayed along the Y-axis to constitute a second array 34. The second array 34 may be disposed at one side of the first array 32, and one of the vertical transistors 21 and 22 commonly connected to the word line WL2 and one of the vertical transistors 23 and 24 commonly connected to the word line WL1 may be disposed in a single row between the word lines WL1 and WL2. Thus, the first transistor block 31 connected to the word line WL2 and the second transistor block 33 connected to the word line WL1 may be arrayed in a diagonal direction which is parallel with the Z-axis in the X-Y plane. The second common gate 13b may control the operation of the second transistor block 33 including the pair of adjacent vertical transistors 23 and 24.

The first array 32 and the second array 34 may be alternately and repeatedly arrayed in the X-axis direction. Further, the common gates 13a, 13b, 13c, 11, 17, 15a, 15b and 15c may be located at central points of respective ones of the corresponding transistor blocks. Thus, the common gates 11, 13b, 15b and 17 of the four adjacent transistor blocks connected to the word lines WL1, WL2 and WL3 may be located at respective ones of four vertices of a diamond shape.

In order that the common gates 11, 13b, 15b and 17 are located at respective ones of four vertices of a diamond shape, the common gates 11, 13a, 13b, 13c, 15a, 15b, 15c and 17 should be located at cross points of the word lines WL0, WL1, WL2 and WL3 and imaginary lines 61 which are parallel with the Z-axis corresponding to a diagonal line in the X-Y plane, as illustrated in FIG. 3. That is, the imaginary lines 61 may intersect the word lines WL0, WL1, WL2 and WL3 at a non-right angle. Each of the vertical transistors 21, 22, 23 and 24 may include a vertical active pillar in which a source region (or drain region), a channel region and a drain region (or a source region) are sequentially stacked. Thus, the common gates 11, 13a, 13b, 13c, 15a, 15b, 15c and 17 may overlap sidewalls of channel regions of the active pillars to have columnar structures.

As described above, the first array 32 including the first transistor blocks 31 and the second array 34 including the second transistor blocks 33 may be alternately and repeatedly arrayed in the X-axis direction. The buried bit line BBL2 may be electrically connected to the drain region of the vertical transistor 21 in the first transistor block 31 constituting the first array 32 though a first contact 41. The buried bit line BBL2 may extend in a diagonal line direction substantially parallel with the Z-axis to be in contact with the drain region of the vertical transistor 23 in the second transistor block 33 constituting the second array 34 though a third contact 43. Similarly, the buried bit line BBL1 may be electrically connected to the drain region of the vertical transistor 22 in the first transistor block 31 constituting the first array 32 though a second contact 42, and the buried bit line BBL1 may extend in a diagonal line direction substantially parallel with the Z-axis to be in contact with the drain region of the vertical transistor 24 in the second transistor block 33 constituting the second array 34 though a fourth contact 44.

The pair of vertical transistors 21 and 22 (or 23 and 24), which are commonly connected to the single word line WL2 (or WL1) through the common gate 11 (or 13b), may be independently connected to the separate buried bit lines BBL2 and BBL1, respectively. In addition, the pair of vertical transistors 21 and 23 (or 22 and 24), which is commonly connected to the single buried bit lines BBL2 (or BBL1), may be independently connected to the separate word lines WL2 and WL1, respectively. Thus, if one of the word lines WL0, WL1, WL2 and WL3 is selected and one of the buried bit lines BBL1, BBL2, BBL3, BBL4 and BBL5 is selected, only a single vertical transistor connected to the selected word line and the selected buried bit line may be selected to independently operate. The source region of each of the vertical transistors 21, 22, 23 and 24 may be electrically connected to a capacitor 50 (also, referred to as a cell capacitor) acting as a data storage element, and the capacitor 50 and the vertical transistor connected thereto may constitute a DRAM cell to store a datum.

Figure 4:
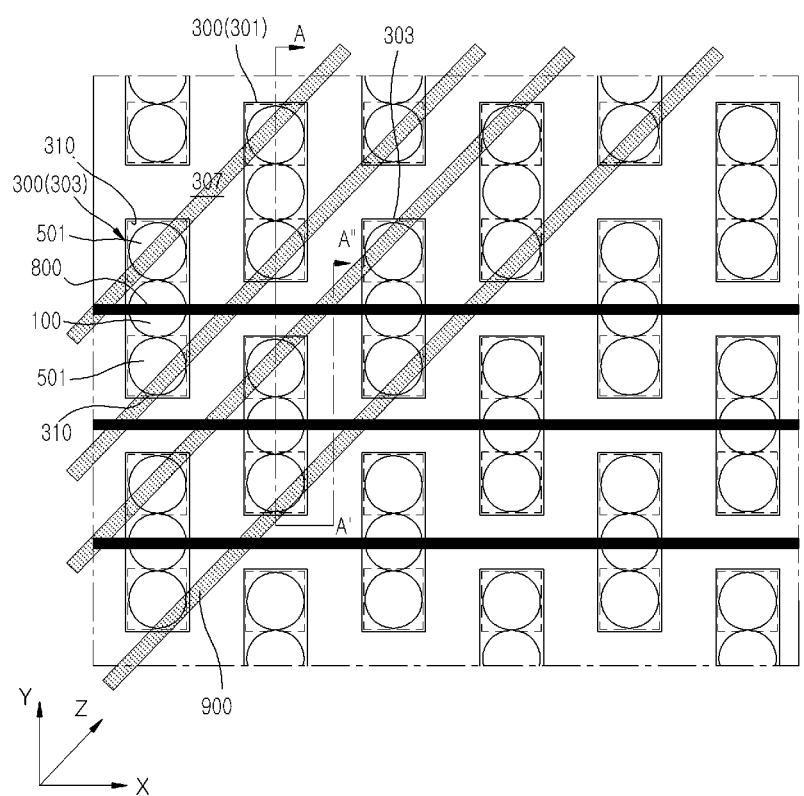
FIG. 4 is a plan view illustrating a semiconductor device according to some embodiments.
Figure 5:
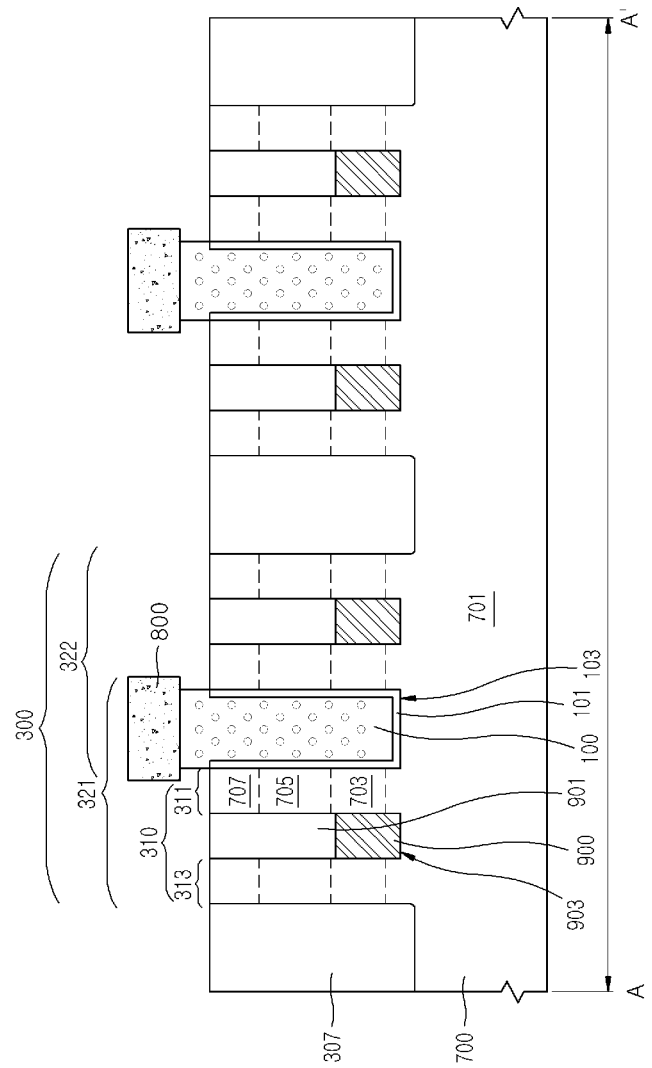
FIG. 5 is a cross sectional view taken along a line A-A' of FIG. 4.
Figure 6A:
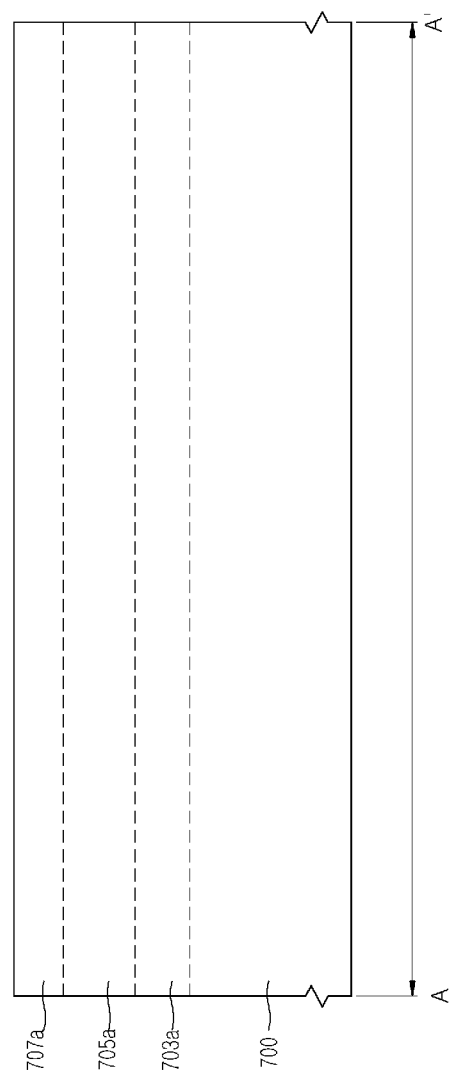
Figure 6B:
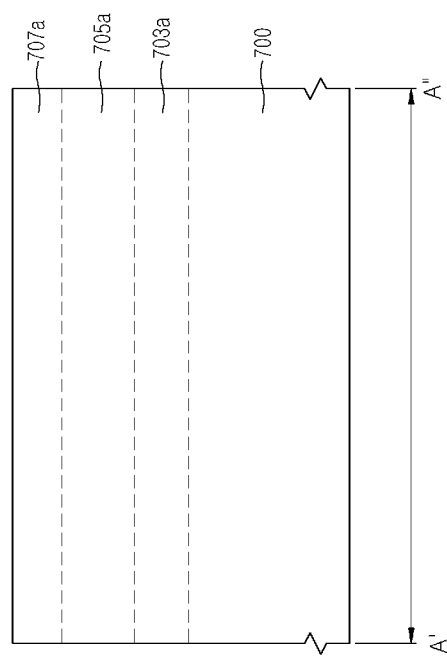

As described above, the pair of adjacent vertical transistors 21 and 22 (or 23 and 24) may share the single common gate 11 (or 13b), and the semiconductor device having this design scheme may be realized on and/or in a semiconductor substrate as illustrated in FIGS. 4 and 5.

FIG. 4 is a plan view illustrating a semiconductor device according to some embodiments, and FIG. 5 is a cross sectional view taken along a line A-A' of FIG. 4.

Referring to FIGS. 4 and 5, a plurality of word lines 800 (WL0, WL1, WL2 and WL3 of FIG. 1) may be disposed on a semiconductor substrate 700 to extend in an X-axis direction which is parallel with a surface of the semiconductor substrate 700. The word lines 800 may have substantially straight line shapes. A plurality of buried bit lines 900 (BBL1, BBL2, BBL3, BBL4 and BBL5 of FIG. 1) may be disposed in the semiconductor substrate 700 to extend in a Z-axis direction that makes an acute angle with the X-axis in a plan view. The buried bit lines 900 may also have substantially straight line shapes. In a single column corresponding to the first array 32 of FIG. 1, a first transistor block 301 (31 of FIG. 1) may be repeatedly arrayed in a Y-axis direction which is perpendicular to the X-axis in a plan view. Further, in another single column corresponding to the second array 34 of FIG. 1, a second transistor block 303 (33 of FIG. 1) may be repeatedly arrayed in the Y-axis direction in a plan view. In the pair of adjacent columns, the first and second transistor blocks 301 and 303 may be arrayed in a zigzag fashion along the Y-axis direction when viewed from a plan view. The first transistor blocks 301 and the second transistor blocks 303 may constitute a plurality of transistor blocks 300. Each of the transistor blocks 300 may include a pair of vertical active pillars 310 and a vertical common gate 100 (11 or 13 of FIG. 1) disposed between the pair of vertical active pillars 310, as illustrated in FIG. 5.

Each of the active pillars 310 may vertically protrude from a substrate body 701 of the semiconductor substrate 700. Each of the active pillars 310 may include a drain region 703, a channel region 705 and a source region 707 which are sequentially stacked on a portion of the substrate body 701. The buried bit lines 900 may be disposed at sides of the drain regions 703. Further, the buried bit lines 900 may be electrically connected to the drain regions 703. The channel regions 705 may be electrically insulated from the buried bit lines 900 by a buried insulation patterns 901 covering top surfaces of the buried bit lines 900.

The source regions 707 of the active pillars 310 may be electrically connected to respective ones of capacitors (50 of FIG. 1) acting as data storage elements required in a DRAM device, and the capacitors 50 may be disposed on respective ones of the source regions 707. Therefore, the source regions 707 may provide storage node sites 501 in a plan view. The storage node sites 501 may be disposed to substantially overlap with portions of the buried bit lines 900 in a plan view, as illustrated in FIG. 4. Thus, the capacitors 50 located on respective ones of the storage node sites 501 may also be disposed to overlap with the portions of the buried bit lines 900 in a plan view.

The buried bit lines 900 may be disposed to be in contact with sidewalls of the drain regions 703. The buried bit lines 900 may be disposed to horizontally cross central portions of the drain regions 703 or may be located at sides of the drain regions 703. In the event that the buried bit lines 900 horizontally cross the central portions of the drain regions 703, each of the active pillars 310 may be divided into a first active pillar 311 and a second active pillar 313 separated from each other and each of the buried bit lines 900 may be disposed between the first active pillar 311 and the second active pillar 313, as illustrated in FIGS. 4 and 5. This may result from a fabrication process of the buried bit lines 900. When the first active pillar 311 is disposed between the common gate 100 and the buried bit line 900 and the second active pillar 313 is located at a side of the buried bit line 900 opposite to the first active pillar 311, the first active pillar 311 may act as an actual body of the vertical transistor and the second active pillar 313 may correspond to a dummy body that does not substantially affect the operation of the vertical transistor. Accordingly, the second active pillars 313 of the active pillars 310 may merely correspond to byproduct which is generated from the fabrication process of the buried bit lines 900.

As described above, in each of the transistor blocks 300, the common gate 100 may be disposed between the pair of active pillars 310. The pair of buried bit lines 900 connected to each transistor block 300 may be separated from the common gate 100 by the pair of active pillars 310 (or the pair of first active pillars 311), and a gate dielectric layer 101 may be disposed between the common gate 100 and the active pillars 310 (or the first active pillars 311). The common gate 100 may downwardly extend to cover at least sidewalls of the channel regions 705 in the pair of active pillars 310. The common gate 100 and one of the pair of active pillars 310 may constitute a first vertical transistor 321 (21 of FIG. 1), and the common gate 100 and the other of the pair of active pillars 310 may constitute a second vertical transistor 322 (22 of FIG. 1). The common gate 100 may extend into the semiconductor substrate 700 between the pair of adjacent buried bit lines 900. That is, the common gate 100 may downwardly extend to separate the drain region 703 in one of the pair of active pillars 310 from the drain region 703 in the other of the pair of active pillars 310. Thus, whereas the first and second vertical transistors 321 and 322 share the common gate 100, the common gate 100 may separate the first vertical transistor 321 from the second vertical transistor 322.

Each of the common gates 100 may be formed to have a vertical pillar structure with a horizontal sectional view of a circular shape, a rectangular shape or an oval shape. Top portions of the common gates 100 may be electrically connected to the word lines 800. As a result, the pair of adjacent vertical transistors 321 and 322 may be commonly connected to the single word line 800. That is, the pair of active pillars 310 (or the pair of first active pillars 311) belonging to one of the transistor blocks 300 may be disposed at both sides of one of the word lines 800 in a plan view and may be mirror symmetric with respect to the word line 800 (or the common gate 100) therebetween. The transistor block 300 including the pair of adjacent first active pillars 311 and the common gate 100 therebetween may be electrically connected to the single word line 800 intersecting the transistor block 300 in a plan view. In particular, the first and second transistor blocks 301 and 303 disposed in the pair of adjacent columns may be arrayed in a zigzag fashion along the Y-axis direction in a plan view, as described above. Thus, one of the word lines 800 may be electrically connected to one of the first transistor blocks 301 arrayed in each odd column or one of the second transistor blocks 303 arrayed in each even column, as illustrated in FIG. 4. The transistor blocks 300 may be isolated from each other by an isolation layer 307.

Referring again to FIG. 5, each of the active pillars 310 or each of the first active pillars 311 may be formed to include the drain region 703, the channel region 705 and the source region 707 which are sequentially and vertically stacked, as described above. Thus, the channel region 705 controlled by the common gate 100 may be electrically isolated from the substrate body 701 of the semiconductor substrate 700. That is, the channel region 705 may be electro-potentially floated. As a result, each vertical transistor including the drain region 703, the channel region 705, the source region 707 and the common gate 100 may have a floating body.

FIGS. 6A to 15A are cross sectional views taken along a line A-A' of FIG. 4 to illustrate a method of manufacturing a semiconductor device according to some embodiments, and FIGS. 6B to 15B are cross sectional views taken along a line A'-A" of FIG. 4 to illustrate a method of manufacturing a semiconductor device according to some embodiments. Further, FIG. 16 a cross sectional view taken along a line A-A' of FIG. 4 to illustrate a method of manufacturing a semiconductor device according to a modified embodiment. FIGS. 17, 18, 19 and 20 are perspective views illustrating a method of manufacturing a semiconductor device according to some embodiments.

Referring to FIGS. 16A and 16B, a plurality of stacked impurity layers 703a, 705a and 707a may be formed in a semiconductor substrate 700. The impurity layers 703a, 705a and 707a may correspond to a drain region layer, a channel region layer and a source region layer, respectively. The impurity layers 703a, 705a and 707a may be formed using ion implantation processes. If the drain and source region layers 703a and 707a are N-type layers and the channel region layer 705a is a P-type layer, the impurity layers 703a, 705a and 707a may be formed by implanting N-type impurity ions into the semiconductor substrate 700 to form the drain region layer 703a, implanting P-type impurity ions into the semiconductor substrate 700 on the drain region layer 703a to form the channel region layer 705a, and implanting N-type impurity ions into the semiconductor substrate 700 on the channel region layer 705a to form the source region layer 707a. The drain region layer 703a, the channel region layer 705a and the source region layer 707a may be sequentially stacked by appropriately adjusting ion implantation energies when the implantation processes for forming the drain region layer 703a, the channel region layer 705a and the source region layer 707a are performed. When the semiconductor substrate 700 is a P-type semiconductor substrate, the ion implantation process for forming the channel region layer 705a having a P-type may be omitted. In some embodiments, the impurity layers 703a, 705a and 707a may be formed to have a P-type, an N-type and a P-type, respectively. That is, the drain region layer 703a, the channel region layer 705a and the source region layer 707a may be formed to have a P-type, an N-type and a P-type, respectively. The impurity layers 703a, 705a and 707a may be formed using a plasma doping process or a diffusion process instead of an ion implantation process. In some embodiments, each of the drain region layer 703a, the channel region layer 705a and the source region layer 707a may not be formed throughout the semiconductor substrate 700. That is, each of the drain region layer 703a, the channel region layer 705a and the source region layer 707a may be locally formed in portions of the semiconductor substrate 700.

Figure 7B:
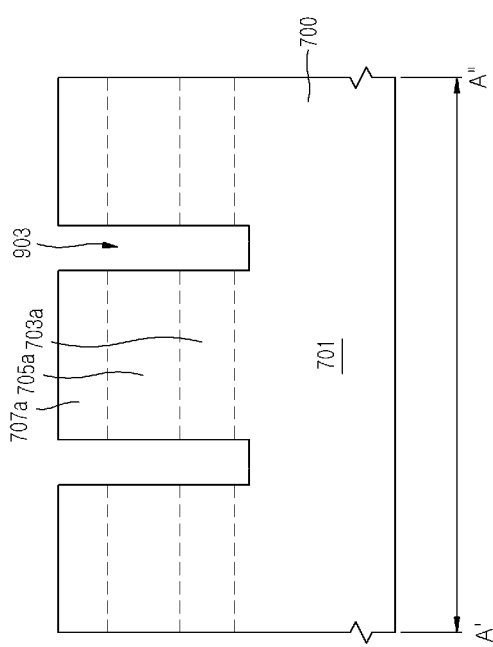
Figure 17:
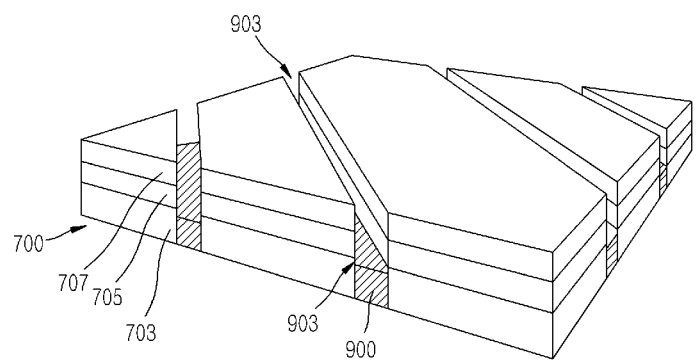
FIGS. 17, 18, 19 and 20 are perspective views illustrating a method of manufacturing a semiconductor device according to some embodiments.

Referring to FIGS. 7A, 7B and 17, bit line trenches 903 may be formed in the semiconductor substrate 700 including the drain region layer 703a, the channel region layer 705a and the source region layer 707a. The bit line trenches 903 may be formed to have substantially straight line shapes extending in one direction which is parallel with the Z-axis of FIG. 4. In some embodiments, each of the bit line trenches 903 may be locally bent, but may substantially extend in the direction which is parallel with the Z-axis.

In order to form the bit line trenches 903, an etch mask (not shown) in which shapes of the buried bit lines 900 of FIG. 4 are transferred may be formed on a surface of the source region layer 707a opposite to the channel region layer 705a, and the semiconductor substrate 700 exposed by the etch mask may be etched. The bit line trenches 903 may be formed to extend into the drain region layer 703a but not to expose a substrate body 701 under the drain region layer 703a. Alternatively, the bit line trenches 903 may be formed to expose the substrate body 701 under the drain region layer 703a, as illustrated in FIGS. 7A and 7B.

Figure 8B:
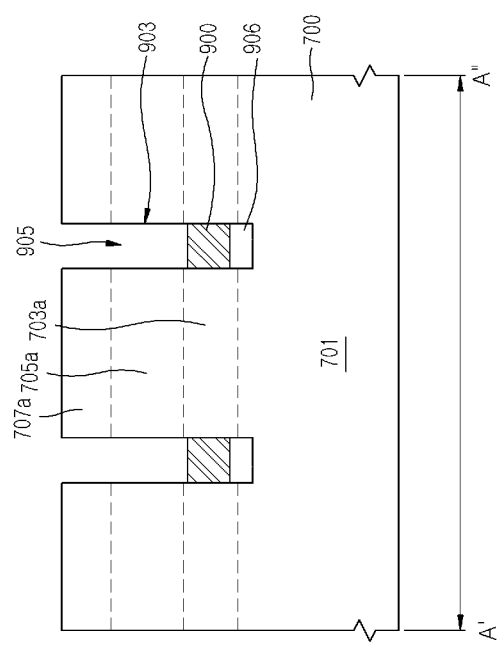

Referring to FIGS. 8A, 8B and 17, buried bit lines 900 may be formed in respective ones of the bit line trenches 903. Specifically, a conductive layer may be deposited in the bit line trenches 903 and on the semiconductor substrate 700, and the conductive layer may be etched back to form conductive patterns (e.g., the buried bit lines 900) in respective ones of lower portions of the bit line trenches 903 and to provide gaps 905 in respective ones of the bit line trenches 903 on the buried bit lines 900. The conductive layer may be etched back such that the gap regions 905 completely expose sidewalls of the channel region layer 705a. This is for electrically isolating the channel region layer 705a from the buried bit lines 900. The conductive layer may be formed of a metal layer (e.g., a tungsten layer) or a doped polysilicon layer. The buried bit lines 900 may be formed to be electrically connected to the drain region layer 703a. For example, the buried bit lines 900 may be formed to be in contact with sidewalls of the drain region layer 703a.

Figure 16:
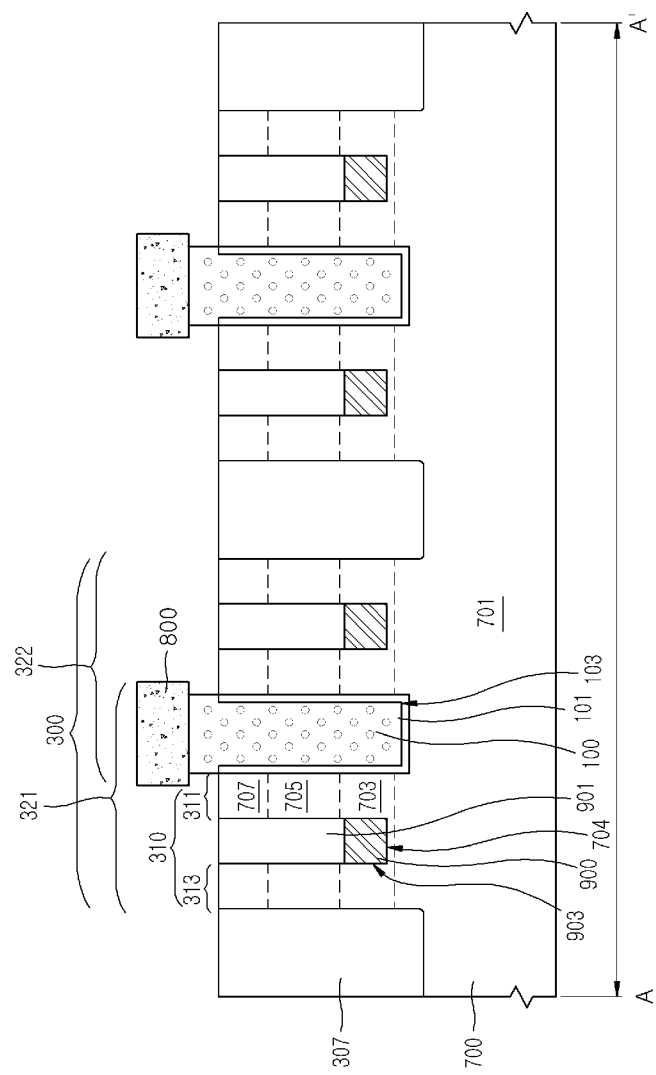
FIG. 16 a cross sectional view taken along a line A-A' of FIG. 4 to illustrate a method of manufacturing a semiconductor device according to a modified embodiments.

Prior to formation of the buried bit lines 900, bottom insulation patterns 906 may be formed on respective ones of bottom surfaces of the bit line trenches 903. The bottom insulation patterns 906 may electrically insulate the buried bit lines 900 from the substrate body 701. The bottom insulation patterns 906 may be formed by depositing an insulation layer such as a silicon oxide layer on the substrate including the bit line trenches 903 and by etching back the insulation layer to expose sidewalls of the drain region layer 703a. In some modified embodiments, the bit line trenches 903 may be formed such that bottom surfaces of the bit line trenches 903 are located at a level between upper surfaces and lower surfaces of drain regions 703, as illustrated in FIG. 16. That is, drain extensions 704 laterally protruding from the drain regions 703 may remain under the buried bit lines 900. In such a case, if the process for forming the bottom insulation patterns 906 is omitted, the buried bit lines 900 may be formed to directly contact the drain extensions 704 as well as the sidewalls of the drain regions 703. As a result, a contact resistance between the buried bit lines 900 and the drain regions 703 may be improved even without formation of the bottom insulation patterns 906.

Figure 9B:
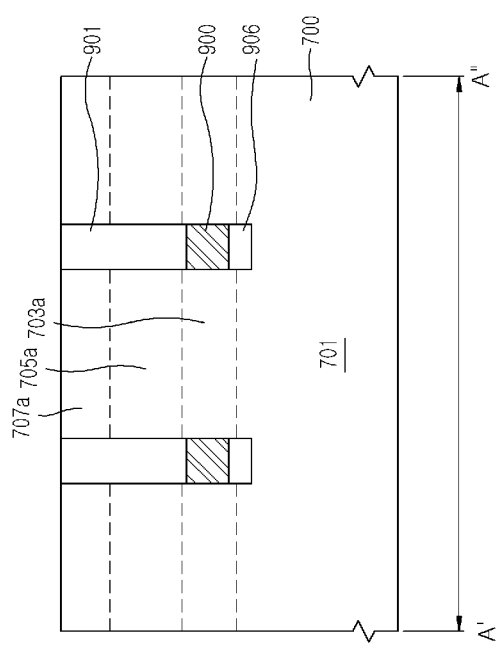
Figure 18:
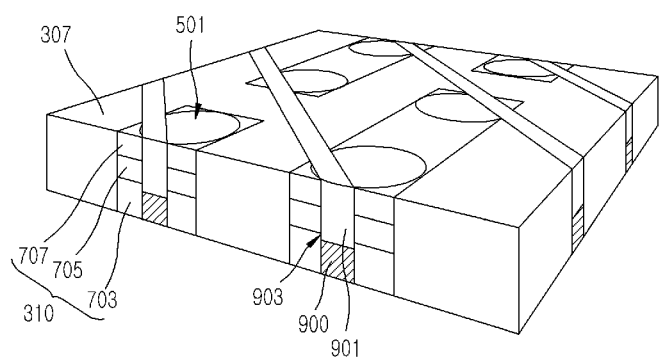

Referring to FIGS. 9A, 9B and 18, buried insulation patterns 901 may be formed in the gaps 905 to cover the buried bit lines 900. The buried insulation patterns 901 may be formed by depositing an insulation layer such as a silicon oxide layer on the substrate including the gaps 905 and by planarizing the insulation layer to expose a top surface of the semiconductor substrate 700 (e.g., the source region layer 707a). The insulation layer may be planarized using a chemical mechanical polishing (CMP) process.

Figure 10B:
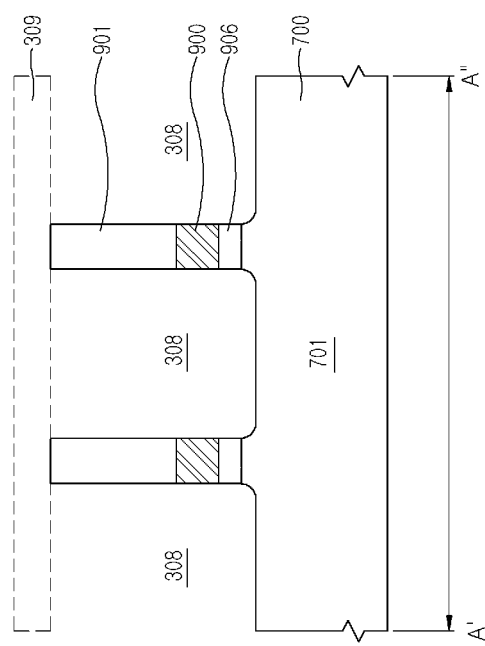

Referring to FIGS. 10A, 10B and 18, an isolation trench 308 may be formed in the semiconductor substrate 700 to define a plurality of active blocks 350 having island shapes in a plan view. That is, the active blocks 350 may be spaced apart from each other by the isolation trench 308. The active blocks 350 may be deformed into active regions constituting the transistor blocks 300 described with reference to FIG. 4 in subsequent processes. The isolation trench 308 may be formed by forming an etch mask 309 on the semiconductor substrate 700 and by etching the semiconductor substrate (e.g., the source region layer 707a, the channel region layer 705a and the drain region layer 703a) exposed by the etch mask 309. The etch mask 309 may be formed to have pattern shapes corresponding to outlines of the transistor blocks 300 shown in FIG. 4. Thus, the active blocks 350 may be formed to include substantially the same shapes as the outlines of the transistor blocks 300 in a plan view.

During formation of the isolation trench 308 defining the active blocks 350, portions of the buried insulation patterns 901 covering the buried bit lines 900 may be exposed to the etching process for forming the isolation trench 308. However, the buried insulation patterns 901 may have an etch selectivity with respect to the semiconductor substrate 700. Thus, the buried insulation patterns 901 may protect the buried bit lines 900 from being damaged or etched during formation of the isolation trench 308, as illustrated in FIG. 10B.

Figure 11A:
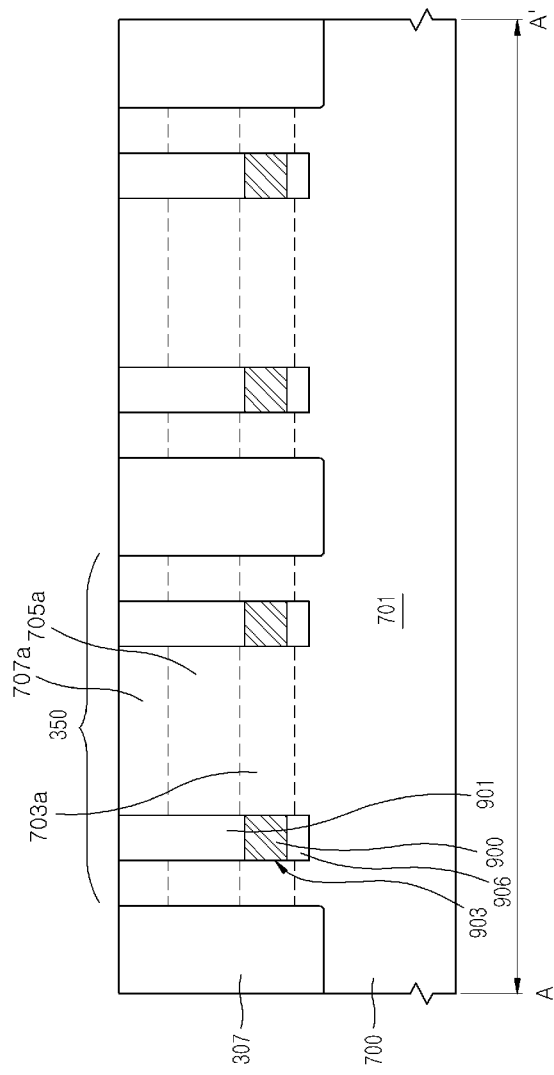
Figure 11B:
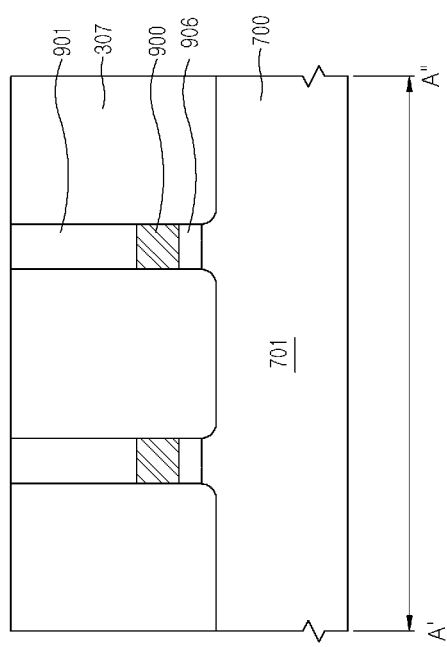

Referring to FIGS. 11A, 11B and 18, an insulation layer such as a silicon oxide layer may be formed to fill the isolation trench 308 and to cover the etch mask 309, and the insulation layer and the eth mask 309 may be planarized to expose the semiconductor substrate 700 (e.g., the source region layer 707a). As a result, an isolation layer 307 may be formed in the isolation trench 308. Thus, the isolation layer 307 may isolate the active blocks 350 from each other.

Figure 12B:
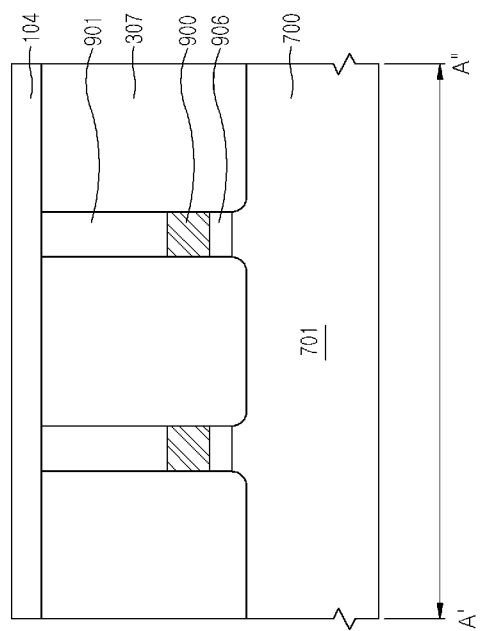
Figure 13A:
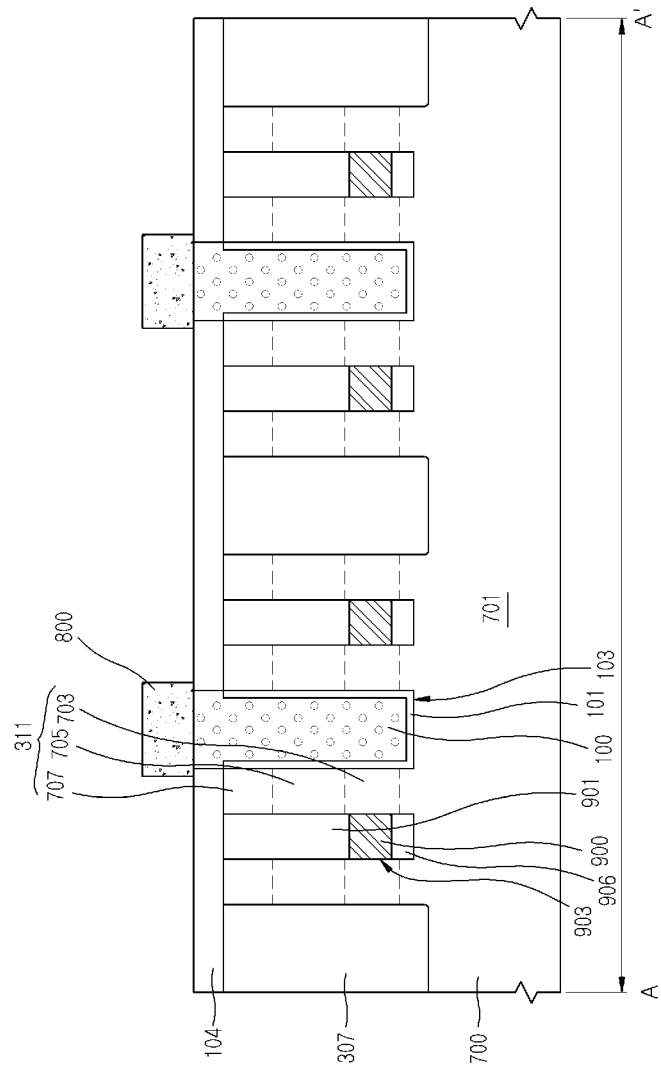
Figure 13B:
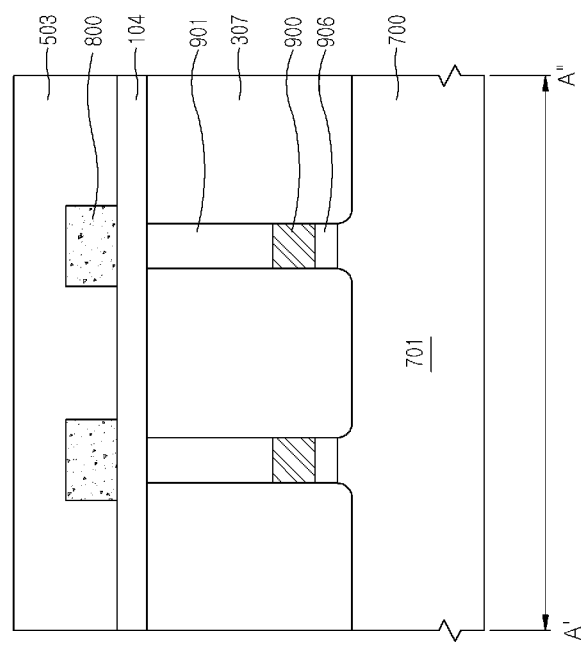
Figure 19:
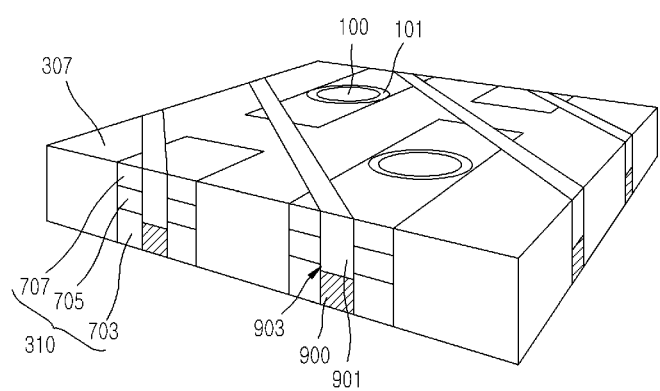
Figure 20:
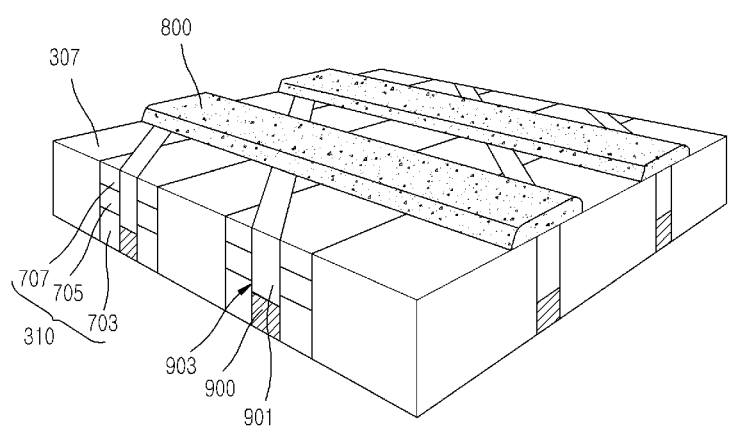

Referring to FIGS. 12A, 12B and 19, gate holes 103 may be formed in respective ones of the active blocks 350. Each of the gate holes 103 may be formed to separate each active block 350 into two parts. Specifically, a first interlayer insulation layer 104 may be formed on the substrate including the isolation layer 307, and the first interlayer insulation layer 104 and the active blocks 350 may be patterned to form the gate holes 103. The gate holes 103 may be formed to expose the substrate body 701. Thus, each of the active blocks 350 may be separated into a pair of active pillars 310 by one of the gate holes 103, and each of the active pillars 310 may include a first active pillar 311 and a second active pillar 312 which are separated by one of the buried bit lines 900. In each of the active blocks 350, the gate hole 103 may be located between the pair of first active pillars 311, and the pair of first active pillars 311 may be located between the pair of second active pillars 312. As a result, each of the active pillars 310 or each of the first and second active pillars 311 and 312 may be formed to include a drain region 703, a channel region 705 and a source region 707 which are sequentially stacked on the substrate body 701. The gate holes 103 may be formed by etching the first interlayer insulation layer 104 and the active blocks 350 with an etch mask (not shown).

Referring to FIGS. 13A, 13B, 19 and 20, a conductive layer, for example, a doped polysilicon layer may be formed in the gate holes 103 and on the first interlayer insulation layer 104, and the conductive layer may be planarized to expose the first interlayer insulation layer 104 and to concurrently form vertical common gates 100 in respective ones of the gate holes 103. The conductive layer may be planarized using a chemical mechanical polishing (CMP) process. Prior to formation of the common gates 100, a gate dielectric layer 101 may be formed on sidewalls and bottom surfaces of the gate holes 103. Subsequently, word lines 800 illustrated in FIGS. 4 and 5 may be formed on the common gates 100 and the first interlayer insulation layer 104. Specifically, a conductive layer, for example, a metal layer such as a tungsten (W) layer may be formed to cover the common gates 100 and the first interlayer insulation layer 104, and the conductive layer may be patterned to form the word lines 800 intersecting the buried bit lines 900 at a non-right angle when viewed from a plan view. The word lines 800 may be formed to be electrically connected to the common gates 100. As a result, a pair of vertical transistors (21 and 22 of FIG. 1 or 23 and 24 of FIG. 1) sharing one of the common gates 100 may be formed in each of the active blocks 350.

Figure 14A:
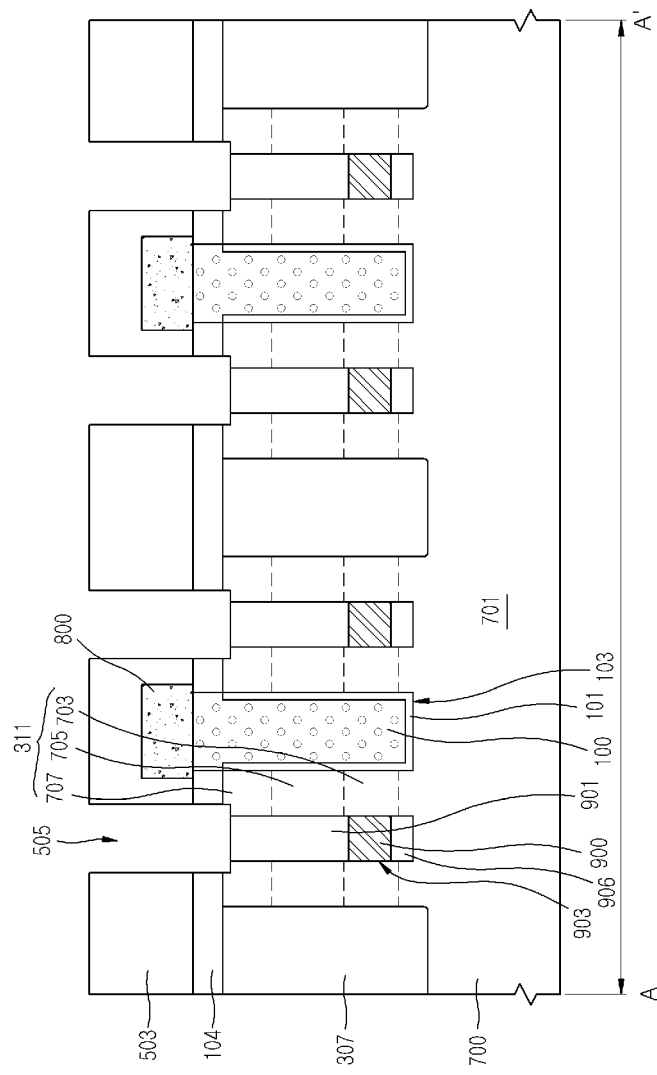
Figure 14B:
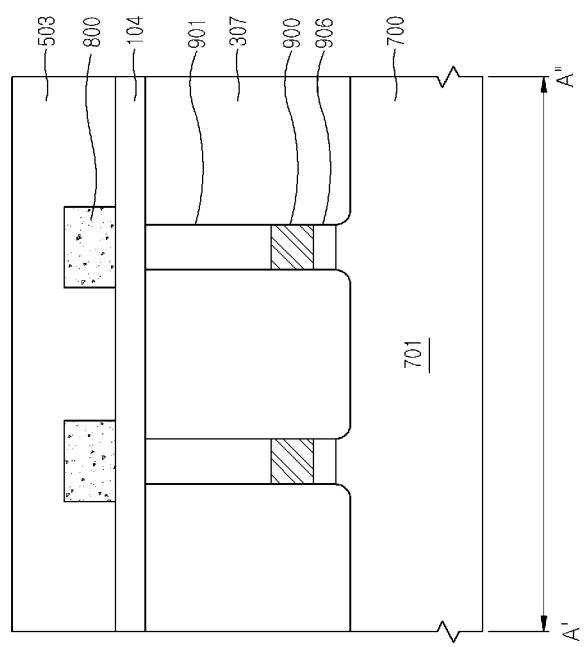

Referring to FIGS. 14A and 14B, a second interlayer insulation layer 503 may be formed to cover the first interlayer insulation layer 104 and the word lines 800. The second interlayer insulation layer 503 and the first interlayer insulation layer 104 may be patterned to form storage node contact holes 505 that expose respective ones of the source regions 707 in the first active pillars 311. When the storage node contact holes 505 are formed, the buried insulation patterns 901 between the first and second active pillars 311 and 312 may be recessed or over-etched to expose upper sidewalls of the source regions 707. In addition, corner regions of the exposed source regions 707 may also be recessed or over-etched during formation of the storage node contact holes 505. These recessions may lead to an increase of the exposed areas of the source regions 707, and the increase of the exposed areas of the source regions 707 may result in a decrease of contact resistance between the source regions 707 and storage nodes formed in a subsequent process.

Figure 15A:
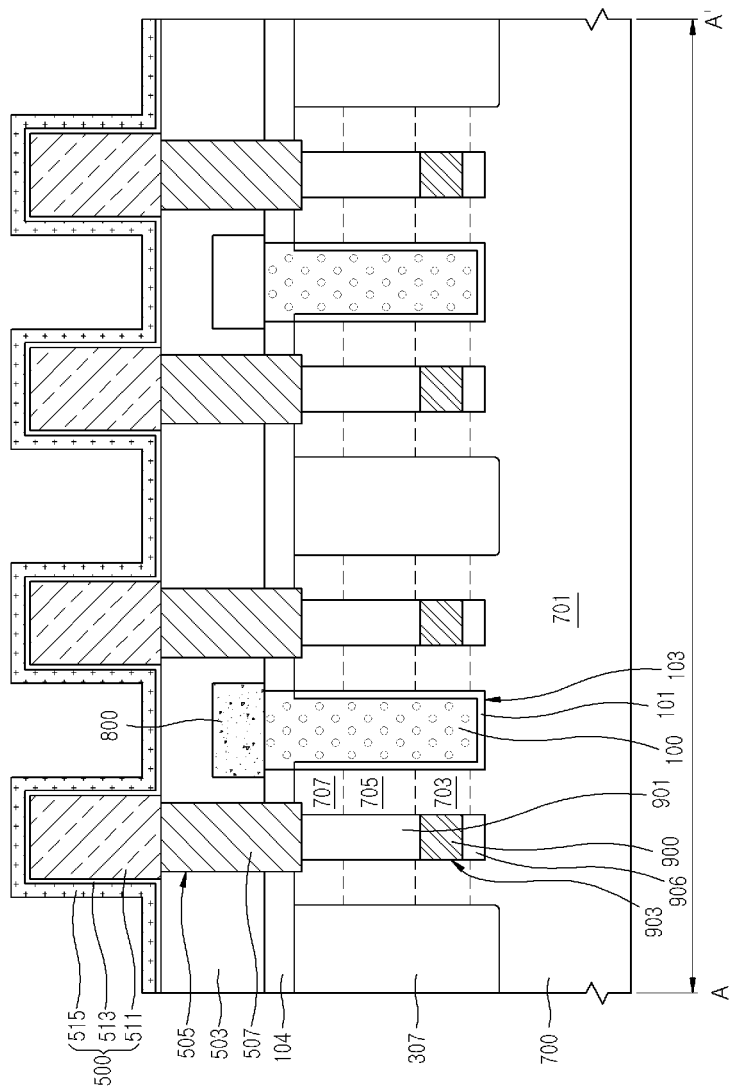
Figure 15B:
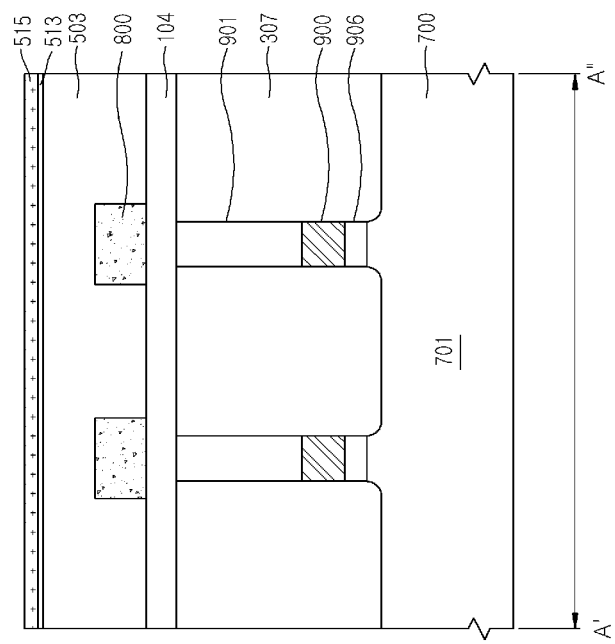

Referring to FIGS. 15A and 15B, storage node contact plugs 507 may be formed in respective ones of the storage node contact holes 505, and storage node electrodes 511 may be formed on respective ones of the storage node contact plugs 507. A capacitor dielectric layer 513 and a plate electrode 515 may be sequentially formed on the storage node electrodes 511 to complete DRAM cells. The plate electrode 515, the capacitor dielectric layer 513 and one of the storage node electrodes 511 may constitute a capacitor 500.

Figure 21:
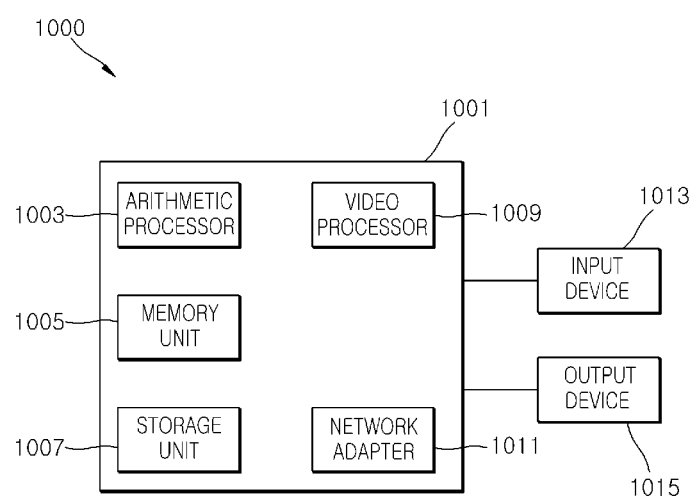
FIG. 21 is a schematic block diagram illustrating an example of electronic systems including semiconductor devices according to some embodiments.

FIG. 21 is a schematic block diagram illustrating an example of electronic systems including semiconductor devices according to some embodiments. The semiconductor devices according to the previously described embodiments may be employed in electronic systems 1000, for example, computers, mobile phones or the like. The electronic system 1000 may be configured to include a main board 1001 and various semiconductor devices and/or semiconductor packages mounted on the main board 1001. The main board 1001 may be a printed circuit board (PCB). At least one of the semiconductor packages may include one of the semiconductor devices according to the embodiments described with reference to FIGS. 1 to 20.

The electronic system 1000 may be configured to include an arithmetic processor 1003, a memory unit 1005, a storage unit 1007, a video processor 1009 and a network adapter 1011 which are mounted on the main board 1001 to communicate with each other through a data bus (not shown). The arithmetic processor 1003 may be a microprocessor, and the memory unit 1005 may be a semiconductor package including a semiconductor device (e.g., a DRAM device) according to one of the above embodiments. Further, the storage unit 1007 may include a nonvolatile memory device and/or a hard disk, and the video processor 1009 may be a semiconductor package including memory chips such as video DRAM chips for temporarily storing video data and a video controller for processing/controlling the video data stored in the video DRAM chips. In addition, the network adapter 1011 may correspond to an interface unit. That is, the network adapter 1011 may transmit electrical data to an external communication network or may receive electrical data from the external communication network.

Program data stored in the storage unit 1007 may be loaded in the memory unit 1005 through the data bus and may be executed by the arithmetic processor 1003. In some embodiments, the storage unit 1007 may be configured to include a solid state disk (SSD, also referred to as a solid state drive) having a plurality of flash memory devices. In addition, the electronic system 1000 may further include an input device 1013 for receiving data and an output device 1015 for displaying data processed therein. The input device 1013 may include a keyboard or a touch sensitive display screen, and the output device 1015 may include a display monitor, a printer or a display screen. The electronic system 1000 may correspond to a personal computer, a server or a mobile system. The mobile system may include a laptop computer, a handheld computer or a smart phone.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
   word lines on a semiconductor substrate;
   common gates connected to each of the word lines and vertically disposed in the semiconductor substrate;

buried bit lines intersecting the word lines at a non-right angle in a plan view; and a pair of vertical transistors sharing each of the common gates, wherein the pair of vertical transistors are respectively disposed at both sides of one of the word lines and are electrically and respectively connected to two of the adjacent buried bit lines.

2. The semiconductor device of claim 1, wherein four of the adjacent common gates are located at respective four vertices of a diamond shape in a plan view.

3. A semiconductor device comprising:
word lines on a semiconductor substrate;
common gates connected where the word lines and substantially straight lines that may represent buried bit lines intersect at non-right angles in a plan view and vertically disposed in the semiconductor substrate;
transistor blocks including the respective common gates, each of the transistor blocks including a pair of vertical transistors that are respectively disposed at both sides of one of the word lines to share one of the common gates; and
buried bit lines intersecting the word lines at a non-right angle in a plan view,
wherein the pair of vertical transistors in each of the transistor blocks are electrically connected to two of the adjacent buried bit lines, respectively.

4. The semiconductor device of claim 3,
wherein four of the adjacent common gates are located at respective four vertices of a diamond shape in a plan view; and
wherein the transistor blocks are arrayed on diagonal lines in an X-Y plane including an X-axis parallel with the word lines and a Y-axis perpendicular to the X-axis.

5. The semiconductor device of claim 3,
wherein the buried bit lines are arrayed to be substantially parallel with the diagonal lines;
wherein the pair of vertical transistors constituting each of the transistor blocks correspond to a first vertical transistor and a second vertical transistor, respectively; and
wherein the first vertical transistors of the transistor blocks arrayed along one of the diagonal lines are electrically connected to one of the buried bit lines.

6. A semiconductor device comprising:
a pair of buried bit lines on a substrate body;
a pair of vertical active pillars upwardly protruding from the substrate body, lower portions of the pair of vertical active pillars being in contact with the respective pair of buried bit lines;
a common gate between the pair of vertical active pillars; and
a word line connected to the common gate,
wherein the word line intersects the pair of buried bit lines at a non-right angle in a plan view.

7. The semiconductor device of claim 6, wherein each of the pair of active pillars includes:
a drain region disposed on the substrate body and connected to one of the pair of buried bit lines;
a channel region on the drain region opposite to the substrate body; and
a source region on the channel region opposite to the drain region,
wherein the drain region, the channel region, and the source region are sequentially stacked.

8. The semiconductor device of claim 7, wherein the common gate downwardly extends to cover sidewalls of the channel regions in the pair of active pillars.

9. The semiconductor device of claim 7, wherein the common gate downwardly extends to cover sidewalls of the channel regions and the drain regions in the pair of active pillars.

10. The semiconductor device of claim 6, further comprising a pair of data storage elements disposed on respective upper portions of the pair of active pillars.

11. The semiconductor device of claim 10, wherein each of the pair of data storage elements includes a capacitor.

12. The semiconductor device of claim 11, wherein the pair of data storage elements is disposed over the respective pair of buried bit lines.

13. A semiconductor device comprising:
a pair of buried bit lines on a substrate body;
a pair of word lines intersecting the pair of buried bit lines at a non-right angle in a plan view; and
a first transistor block and a second transistor block connected to the respective pair of word lines,
wherein each of the first and second transistor blocks includes a pair of vertical active pillars upwardly protruding from the substrate body and a common gate disposed between the pair of vertical active pillars to contact one of the pair of word lines, and
wherein one of the pair of buried bit lines is electrically connected to a lower portion of one of the pair of active pillars in the first transistor block and a lower portion of one of the pair of active pillars in the second transistor block, and the other pair of buried bit lines is electrically connected to a lower portion of the other of the pair of active pillars in the first transistor block and a lower portion of the other pair of active pillars in the second transistor block.

14. The semiconductor device of claim 13, wherein each of the pair of active pillars includes:
a drain region disposed on the substrate body and electrically connected to one of the pair of buried bit lines;
a channel region on the drain region opposite to the substrate body; and
a source region on the channel region opposite to the drain region,
wherein the drain region, the channel region, and the source region are sequentially stacked.

15. The semiconductor device of claim 14, wherein the common gates downwardly extend to cover sidewalls of the channel regions of the active pillars in the first and second transistor blocks.

16. The semiconductor device of claim 14, wherein the common gates downwardly extend to cover sidewalls of the channel regions and the drain regions of the active pillars in the first and second transistor blocks.

17. The semiconductor device of claim 14, further comprising capacitors disposed on the respective source regions of the active pillars in the first and second transistor blocks.

18. The semiconductor device of claim 13, wherein the common gates of the first and second transistor blocks are disposed on a diagonal line which is substantially parallel with the buried bit lines in a plan view.

19. The semiconductor device of claim 13, wherein the first and second transistor blocks are disposed on a diagonal line which is substantially parallel with the buried bit lines in a plan view.

20. The semiconductor device of claim 13, wherein the pair of active pillars in each of the first and second transistor blocks are respectively disposed on both sides of one of the pair of word lines and are symmetric with each other with respect to the word line therebetween.

21. An electronic system comprising:
a main board; and a semiconductor device mounted on the main board,
wherein the semiconductor device includes:
   word lines on a semiconductor substrate;
   common gates connected to each of the word lines and vertically disposed in the semiconductor substrate;
   buried bit lines intersecting the word lines at a non-right angle in a plan view; and
   a pair of vertical transistors sharing each of the common gates,
wherein the pair of vertical transistors are respectively disposed on both sides of one of the word lines and are electrically and respectively connected to the two adjacent buried bit lines.

\* \* \* \* \*